(12) United States Patent
Heid

(10) Patent No.: US 6,384,604 B2
(45) Date of Patent: May 7, 2002

(54) "MAGNETIC RESONANCE APPARATUS HAVING A GRADIENT COIL SYSTEM WITH MAGNETOSTRICTIVE MATERIAL"

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/780,241

(22) Filed: Feb. 9, 2001

(30) Foreign Application Priority Data

Feb. 10, 2000 (DE) .......................................... 100 05 882
Jun. 13, 2000 (DE) .......................................... 100 29 064

(51) Int. Cl.[7] ................................................. G01V 3/00
(52) U.S. Cl. ........................................ 324/318; 324/319
(58) Field of Search ................................. 324/318, 319, 324/320, 322, 300, 306, 307, 309

(56) References Cited

U.S. PATENT DOCUMENTS 5,458,222 A * 10/1995 Pla et al. ..................... 324/318
5,952,829 A   9/1999 Melcher et al. ............. 324/318
6,169,404 B1 * 1/2001 Eckels ......................... 324/320

* cited by examiner

*Primary Examiner*—Louis Arana
(74) *Attorney, Agent, or Firm*—Schiff Hardin & Waite

(57) ABSTRACT

A magnetic resonance apparatus has a gradient coil system that includes a gradient coil arrangement with a conductor and magnetostrictive material, and contains a basic field magnet system for generating a basic magnetic field. The magnetostrictive material is thereby arranged in the immediate proximity of the conductor in regions having the same course as a course of the conductor, to suppress noise-producing vibrations.

7 Claims, 4 Drawing Sheets

"MAGNETIC RESONANCE APPARATUS HAVING A GRADIENT COIL SYSTEM WITH MAGNETOSTRICTIVE MATERIAL"

BACKGROUND OF THE INVENTION

1. Field of the Invention

The present invention is directed to a magnetic resonance apparatus of the type having a gradient coil system that includes a gradient coil arrangement with a conductor and magnetostrictive material, and having a basic field magnet system for generating a basic magnetic field.

2. Description of the Prior Art

Magnetic resonance tomography is a known technique for producing images of the inside of the body of an examination subject. To this end, rapidly switched gradient fields that are generated by a gradient coil system are superimposed on a static basic magnetic field in the magnetic resonance apparatus. The static field is generated by a basic field magnet system. The magnetic resonance apparatus also comprises a radio-frequency system that emits radio-frequency signals into the examination subject for producing magnetic resonance signals and that picks up the generated magnetic resonance signals, from which magnetic resonance images are produced.

For generating gradient fields, suitable currents are to be set in the gradient coils. The amplitudes of the required currents amount to several 100 A. The current rise and decay rates amount to several 100 kA/s. Given the presence of a basic magnetic field on the order of magnitude of 1 T, Lorentz forces that lead to oscillations of the gradient coil system act on these temporally variable currents in the gradient coils. These oscillations are forwarded to the surface of the apparatus via various propagation paths. At this surface, these mechanical oscillations are converted into acoustic oscillations that ultimately lead to noise that is disturbing.

For reducing such noise, German OS 196 43 116, corresponding to U.S. Pat. No. 5,952,829, discloses that forces that oppose the Lorentz forces be generated by magnetostriction. Such opposing forces are thereby generated by the same gradient field that also produces the Lorentz forces. This published application proposes for this purpose given a hollow-cylindrical gradient coil system, to provide a magnetostrictive material system composed of planar or strip-shaped, magnetostrictive components, with the gradient coil system, preferably the in longitudinal direction, parallel to the principal axis of the hollow cylinder and/or in circumferential direction. It is primarily the bending vibrations of the hollow cylinder produced by transverse gradient coils that are responsible for the noise. For suppressing these vibrations, it is proposed in this published application that four strip-shaped, magnetostrictive longitudinal elements, that are equally spaced in the circumferential direction, be secured to the hollow-cylindrical gradient coil system. It is especially disadvantageous in this solution that the four strip-shaped longitudinal elements represent large eddy current surfaces. Moreover, a significant amount of magnetostrictive material must be utilized overall for an adequate noise reduction.

SUMMARY OF THE INVENTION

It is an object of the present invention to provide a magnetic resonance apparatus of the type initially described that alleviates the aforementioned disadvantages of known systems of this type.

This object is inventively achieved in a magnetic resonance apparatus wherein magnetostrictive material is arranged in immediate proximity to the conductor in areas having the same course as the course of the conductor of the gradient coil system. As a result, the magnetostrictive material is arranged at those locations at which it experiences a large change in length due to its spatial proximity to the conductor, and thus to a conductor-proximate magnetic field that is produced in the immediate proximity of the conductor by a current flowing in the conductor. The noise-reducing effect is therefore considerable. At the same time, a large-area arrangement of magnetostrictive material is avoided, so that only a small amount of eddy currents can still form in the magnetostrictive material.

In an embodiment, the magnetostrictive material is arranged in areas wherein a section of the conductor has a longitudinal direction substantially perpendicular to the basic magnetic field. A "section" means an imaginary subdivision of the conductor in the longitudinal direction of the conductor, and the longitudinal direction of the section means the direction that a current in the conductor has in the middle of the section.

As a result, the magnetostrictive material is arranged exclusively at those locations at which Lorentz forces act on the conductor, a high noise-reducing effect being thus achieved given a minimal use of material.

In an embodiment, the magnetostrictive material is arranged in areas wherein a conductor-proximate magnetic field, that is produced in the immediate proximity of the conductor by the current therein, has a field component that is co-linear with the basic magnetic field. As a result, a designational length change of the magnetostrictive material is achieved in the direction of the basic magnetic field, so that, for example, a pre-polarization or pre-stressing of the material by the basic magnetic field can be employed.

In another embodiment, the magnetostrictive material is arranged in regions opposite one another with respect to a cross-section of the conductor, such that the material acts with a positive magnetostrictive effect in one of the regions and acts with a negative (opposite) magnetostrictive effect in the region lying opposite. A positive magnetostrictive effect means that the material exhibits an increase in length in the direction of the magnetic field given an increase in a magnetic field permeating the material. Material experiencing a negative magnetostrictive effect exhibits a decrease in length given such an increase in the permeating magnetic field. The noise-reducing effect is intensified by the use of materials with positive and negative magnetostrictive behavior, respectively.

In a further embodiment for a transverse gradient coil arrangement of a hollow-cylindrical gradient coil system with at least one sub-coil fashioned saddle-shaped, the magnetostrictive material is arranged such that the quantity of the material is maximum in the region of a saddleback or ridge line of the sub-coil, and decreases toward the edges of the sub-coil proceeding from the saddleback line. As a result, the banana-shaped bending vibration that is mainly responsible for noise in such a hollow-cylindrical gradient coil system is suppressed and, at the same time, an undesired oscillation in the circumferential direction of the hollow cylinder is prevented from occurring.

In another embodiment, the magnetostrictive material is arranged finely distributed in an electrically non-conductive matrix. As a result, formation of eddy currents in the magnetostrictive material is nearly completely suppressed, and thus disturbing influences on results of a magnetic resonance examination are avoided.

In another embodiment, the magnetostrictive material is fashioned such that a pre-polarization of the material by the basic magnetic field effects an operating range of the material in the predominantly linear region of a flux density length change characteristic of the material. As a result, a uniformly high, noise reducing effect of the magnetostrictive material is achieved independently of the size and direction of the current changing over time in the gradient coil arrangement.

DESCRIPTION OF THE PREFERRED EMBODIMENTS

Figure 1:
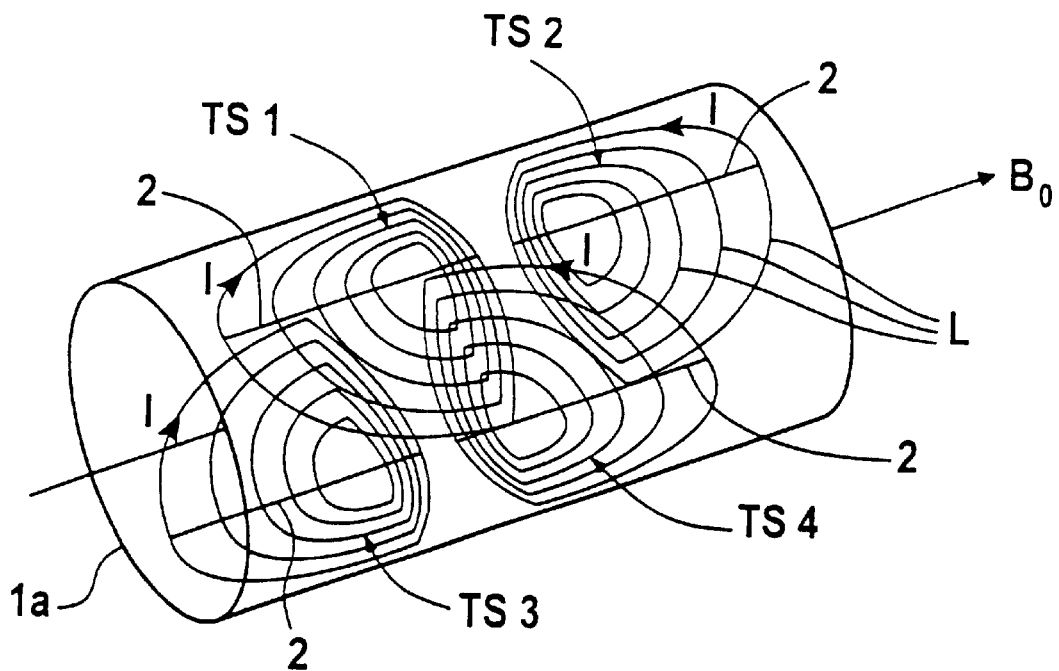
FIG. 1 is a schematic illustration of a hollow-cylindrical gradient coil system having a transversal gradient coil arrangement.

FIG. 1 shows a schematic view of a hollow-cylindrical gradient coil system 1a with a transversal gradient coil arrangement, as is known in the art. The transversal gradient coil arrangement comprises, for example, four sub-coils TS1 through TS4 fashioned as saddle coils. Five loop-shaped sections of a conductor L of the gradient coil arrangement are shown as an example for each sub-coil TS1 through TS4. Additionally, a saddleback or ridge line 2 is shown in FIG. 1 for each sub-coil TS1 through TS4. For clarity, illustration of other components of the gradient coil system 1a, as well as of further gradient coil arrangements, secondary coils, cooling and shim devices, etc., is omitted.

The hollow cylindrical gradient coil system 1a, for example, is built into a bore of a basic field magnet system of a magnetic resonance tomography apparatus. The basic field magnet generates a uniform, static basic magnetic field $B_0$ that essentially permeates the entire gradient coil system. For producing magnetic resonance images, a gradient coil current I is rapidly switched in the conductor L of the gradient coil arrangement. Given the presence of the basic magnetic field $B_0$, Lorentz forces that lead to oscillations of the gradient coil system 1a and, proceeding therefrom, to noise, act on the conductor L with current flowing therein.

Figure 2:
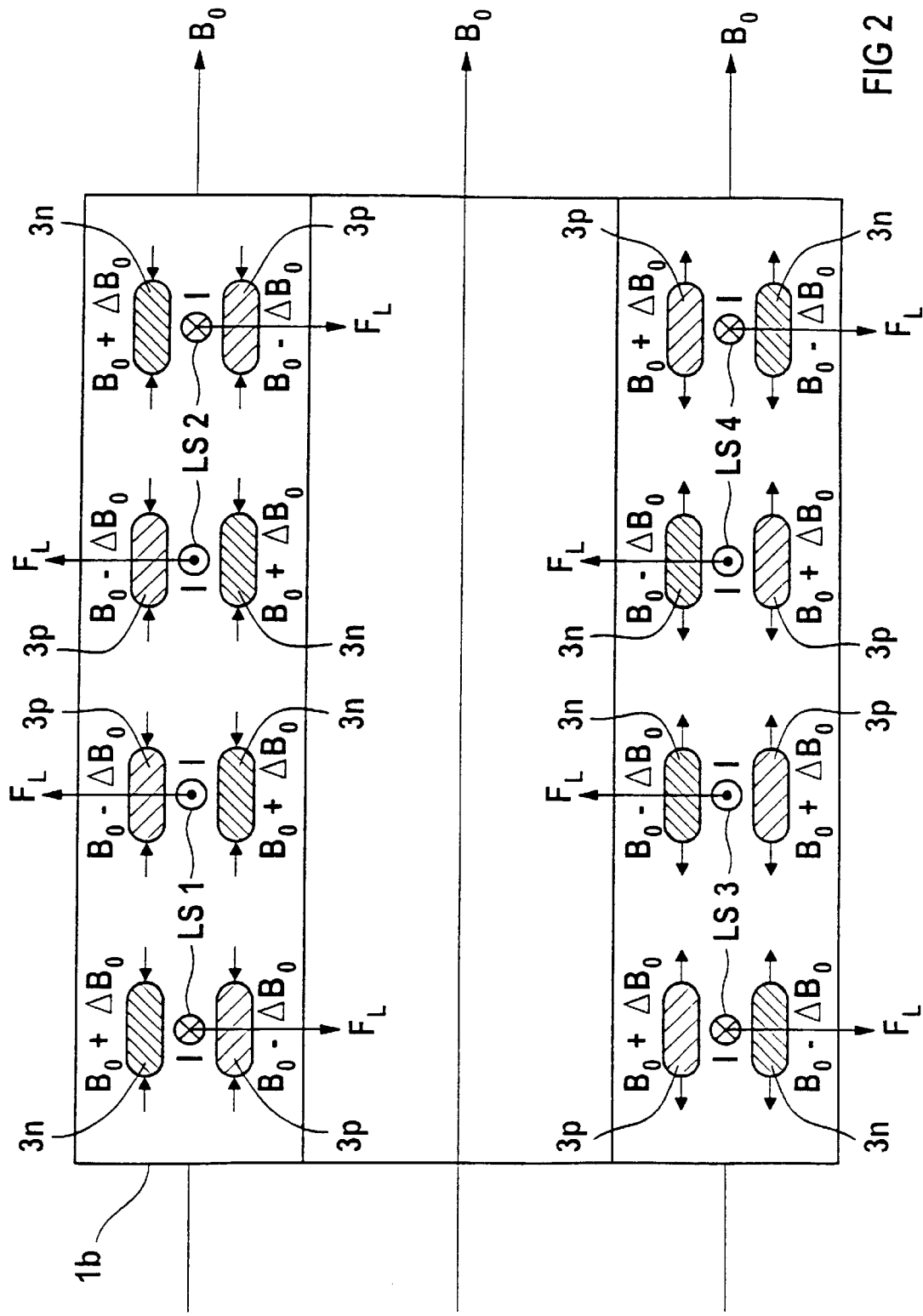
FIG. 2 is a longitudinal section through a hollow-cylindrical gradient coil system in accordance with the invention having a transversal gradient coil arrangement.

As an exemplary embodiment of the invention, FIG. 2 shows a longitudinal section through a hollow-cylindrical gradient coil system 1b. For clarity, only one transversal gradient coil arrangement composed of four saddle-shaped sub-coils is again shown, and only one loop-shaped section LS1 through LS4 of a conductor of the gradient coil arrangement is shown. The longitudinal section through the gradient coil system 1b is taken approximately along the saddleback line 2 (FIG. 1) of the sub-coils. It is assumed the conductor has a circular cross-section, accordingly, two circular section faces per conductor loop LS1 through LS4 are shown. The direction in which a gradient coil current I flows are opposite at the two section faces for each of the conductor loops LS1 through LS4, this being indicated by the symbols ⊙ and ⊗. The time-variable gradient coil current I flows through the gradient coil arrangement. At the point in time shown in FIG. 2, let the gradient coil current I have a positive value, so that the Lorentz forces $F_L$ that act on the conductor loops LS1 through LS4 as a consequence of the basic magnetic field $B_0$ have the respective directions indicated by arrows at the illustrated section faces.

For suppressing noise-producing oscillations, magnetostrictive material 3n and 3p is built into the gradient coil system 1b in the immediate proximity of the conductor. Without the magnetostrictive material 3n and 3p, the gradient coil system 1b would be placed into a bending vibration as a consequence of the temporally varying gradient coil current 1, this representing a principal source of noise. Due to a conductor-proximate magnetic field that is produced in the immediate proximity of the conductor loops LS1 through LS4 by the gradient coil current, the material 3n and 3p experiences a length change indicated by arrows that prevents this bending vibration. Further, magnetostrictive material 3n exhibiting a negative magnetostrictive effect is arranged at that side of the cross-section of the conductor loops LS1 through LS4 at which an intensification of the basic magnetic field $B_0$ by a component $+\Delta B_0$ of the conductor-proximate magnetic field occurs as a result of the gradient coil current, and magnetostrictive material 3p with exhibiting a positive magnetostrictive effect is arranged at the opposite side, at which a reduction attenuation of the basic magnetic field $B_0$, by a component $-\Delta B_0$ of the conductor-proximate magnetic field, occurs. The suppressing effect for bending vibrations is intensified by the utilization of material 3n with negative magnetostrictive behavior and material 3p with positive magnetostrictive behavior.

The exclusive use of magnetostrictive materials with negative or positive magnetostrictive behavior is likewise possible in other embodiments. In other embodiments, oval, sickle-shaped and/or teardrop-shaped cross-sections are also possible for the magnetostrictive material instead of the cross-section shown in FIG. 2.

Figure 3:
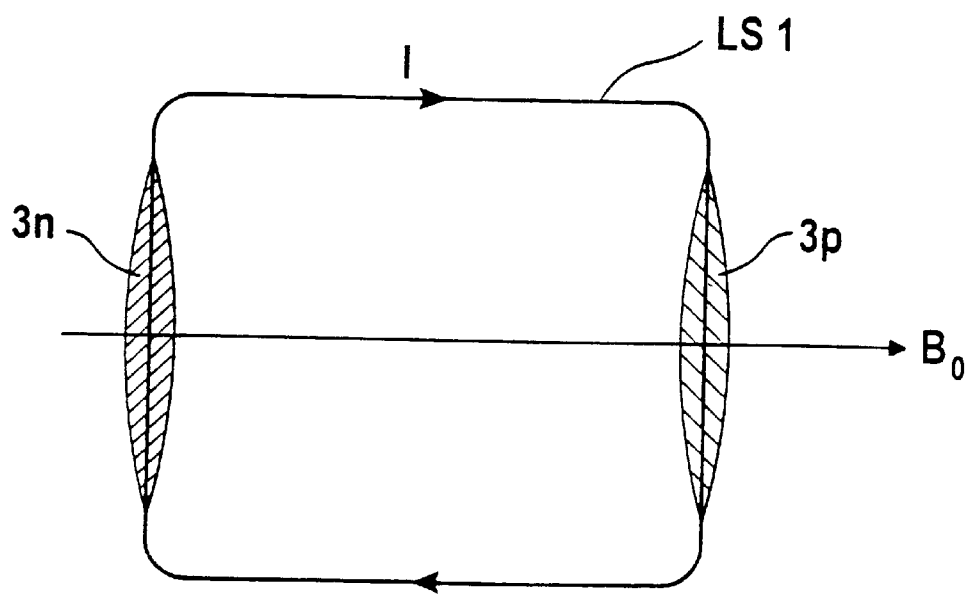
FIG. 3 is a plan view of a conductor loop of the transversal gradient coil arrangement from FIG. 2.

As an example, FIG. 3 shows a plan view of the conductor loop LS1 shown at the upper left in FIG. 2. It can be clearly seen that the magnetostrictive material 3n and 3p is arranged in regions wherein sections of the conductor loop LS1 have a longitudinal direction largely perpendicular to the basic magnetic field $B_0$. Further, the material 3n and 3p exhibits its largest cross-section in the region of the saddleback line of the conductor loop LS1, this cross-section tapering more and more as the distance from the saddleback line increases. The above arrangement of the magnetostrictive material 3n and 3p prevents an additional, unwanted oscillation of the hollow-cylindrical gradient coil system 1b from being excited in the circumferential direction by magnetostriction. This would be the case, if magnetostrictive material 3n and 3p were arranged with a constant cross-section without a taper along the entire section of the conductor loop LS1 directed perpendicularly to the basic magnetic field $B_0$.

Figure 4:
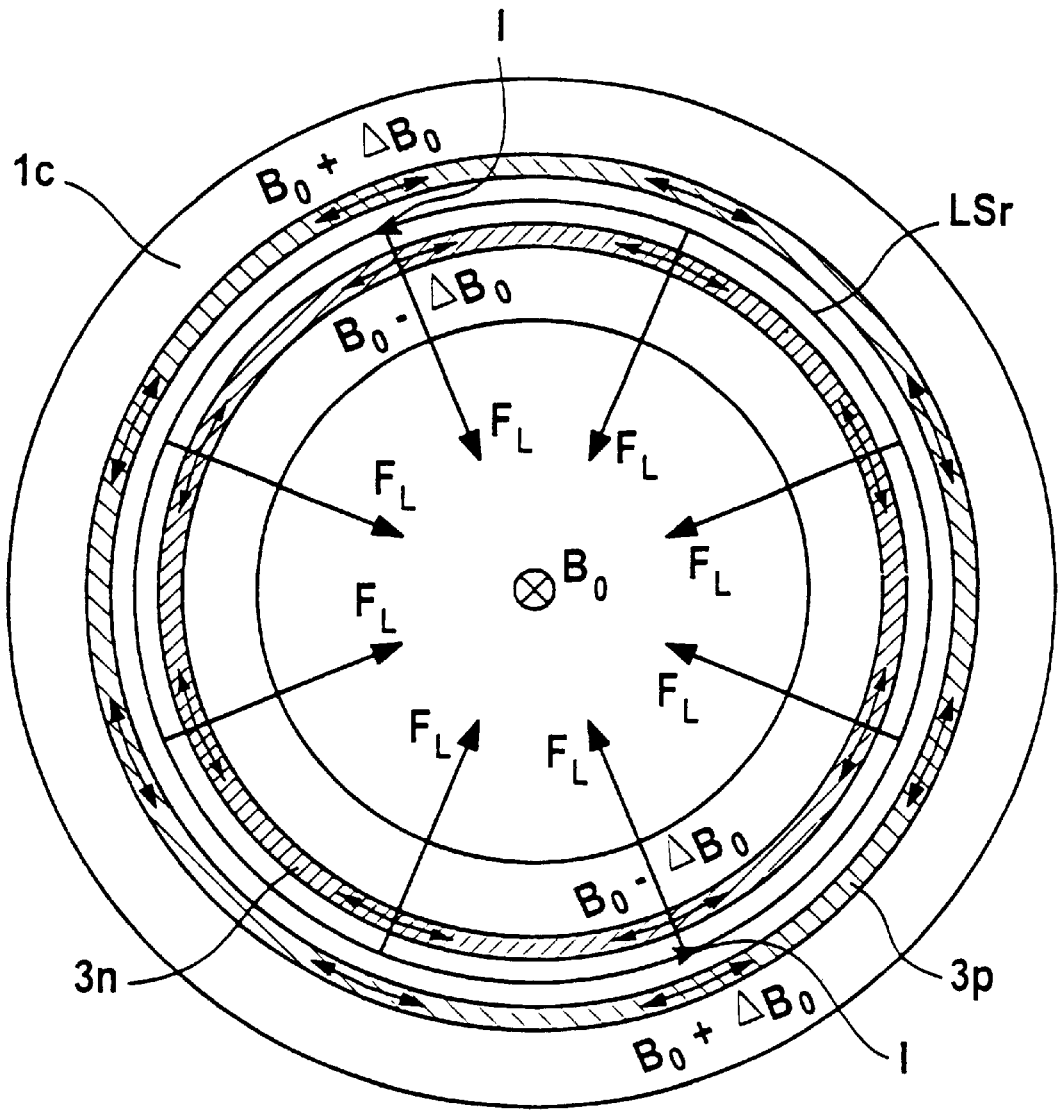
FIG. 4 is a cross-section through a hollow-cylindrical gradient coil system in accordance with the invention having a longitudinal gradient coil arrangement.

As a further exemplary embodiment of the invention, FIG. 4 shows a cross-section through a hollow-cylindrical gradient coil system 1c with a longitudinal gradient coil arrangement. For clarity, only one annular conductor loop LSr of a conductor of the gradient coil arrangement is shown. At the illustrated point in time, let the gradient coil current I flowing in the annular conductor loop LSr be positive. Given the directions defined for the gradient coil current I and the basic magnetic field $B_0$, the Lorentz forces $F_L$ act on the annular conductor loop LSr in the influencing direction shown with arrows. This effects a contraction of the annular conductor loop LSr. Due to the gradient coil current I varying over time, this would lead to a noise-producing circumferential vibration of the gradient coil system 1c. Analogous to the example of a transversal gradient coil arrangement shown in FIG. 2, magnetostrictive material 3n and 3p of magnetostrictive behavior is introduced into the gradient coil system 1c in an annular arrangement at both sides of the annular conductor loop LSr for suppressing this circumferential vibration. The functioning of the magnetostrictive material 3p and 3n in FIG. 4 is analogous to that of FIG. 2.

Figure 5:
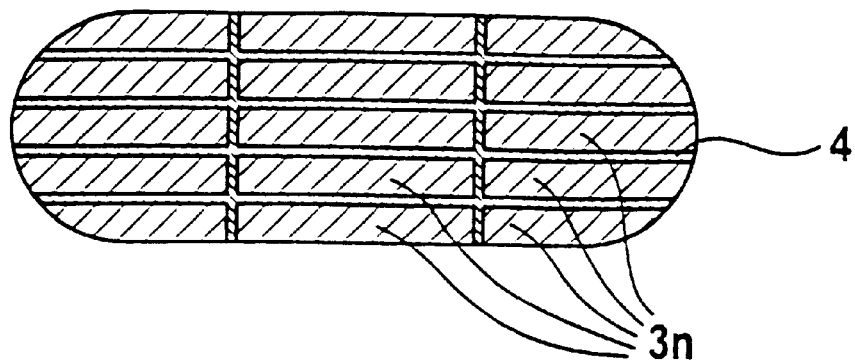
FIG. 5 is a cross-section through an arrangement of magnetostrictive material in a matrix in accordance with the invention.

As an exemplary embodiment of the invention, FIG. 5 shows how the material 3n can be arranged finely distributed in an electrically non-conductive matrix 4, for example for a cross-section of the magnetostrictive material 3n with negative magnetostrictive behavior from FIG. 2. For example, the material 3n is arranged as a powder in a matrix 4 of plastic.

Figure 6:
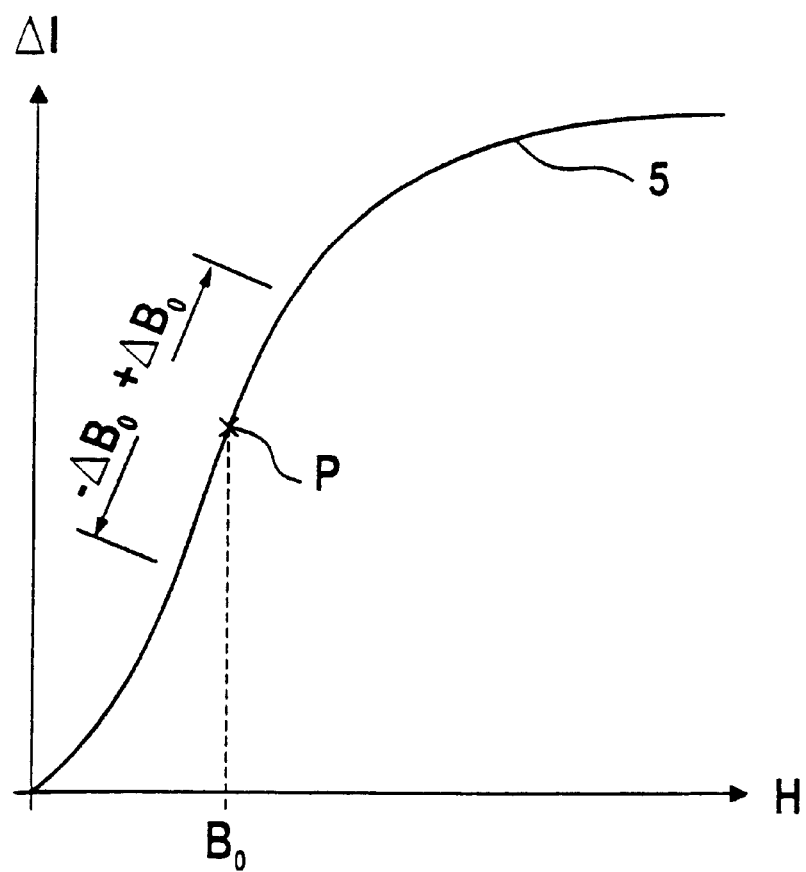
FIG. 6 shows a flux density/length change characteristic of magnetostrictive material.

As an exemplary embodiment of the invention, FIG. 6 shows a flux density/length change characteristic 5, for example for the magnetostrictive material 3p with positive magnetostrictive behavior. The flux density/length change characteristic 5 thereby characterizes the length change $\Delta l$ of the magnetostrictive material 3p in a spatial direction, preferably corresponding to a direction of a basic magnetic field $B_0$, dependent on a magnetic flux density H of a magnetic field that permeates the material 3p in said direction. The flux density/length change characteristic 5 is selected such that the flux density of the basic magnetic field $B_0$ produces an operating point P in the linear region of the characteristic 5, and a length change of the material 3p as a consequence of a conductor-proximate magnetic field that effects an intensification of the basic magnetic field $B_0$ by a component $+\Delta B_0$ or a reduction by a component $-\Delta B_0$, in the generally linear region of the characteristic 5.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
a basic field magnet system which generates a basic magnetic field;
a gradient coil system having a gradient coil arrangement formed by at least one conductor in which current flows, said conductor following a conductor path to form a gradient coil in said gradient coil arrangement; and
said gradient coil system further comprising magnetostrictive material disposed in immediate proximity to said conductor in regions following said conductor path to reduce noise produced by vibrations caused by Lorentz forces arising when current flows in said conductor in said basic magnetic field.

2. A magnetic resonance apparatus as claimed in claim 1 wherein said conductor has a conductor section proceeding in a longitudinal direction substantially perpendicular to said basic magnetic field, and wherein said magnetostrictive material is disposed in a region immediately proximate said conductor section.

3. A magnetic resonance apparatus as claimed in claim 1 wherein said current in said conductor produces a conductor-proximate magnetic field in a field region, having a field component that is co-linear with said basic magnetic field, and wherein said magnetostrictive material is disposed in said field region.

4. A magnetic resonance apparatus as claimed in claim 1 wherein said magnetostrictive material is disposed in first and second separate regions on opposite sides of a cross-section of said conductor, said magnetostrictive material in said first region being of a first type which exhibits a positive magnetostrictive effect, and said magnetostrictive material in said second region being of a second type which exhibits a negative magnetostrictive effect.

5. A magnetic resonance apparatus as claimed in claim 1 wherein said gradient coil system is a hollow-cylindrical gradient coil system and wherein said gradient coil arrangement is a transversal gradient coil arrangement having at least one saddle-shaped sub-coil, with a saddleback line, and wherein said magnetostrictive material is arranged with a maximum thickness in a region of said saddleback line, and decreasing in thickness proceeding away from said saddleback line toward edges of said sub-coil.

6. A magnetic resonance apparatus as claimed in claim 1 wherein said gradient coil system comprises an electrically non-conductive matrix in which said magnetostrictive material is finally distributed.

7. A magnetic resonance apparatus as claimed in claim 1 wherein magnetostrictive material has a flux density/length change characteristic with a primarily linear region, and wherein said magnetostrictive material is pre-polarized by said basic magnetic field so that said magnetostrictive material operates in said primarily linear region.

* * * * *